United States Patent [19]
Brooks et al.

[11] Patent Number: 5,834,940
[45] Date of Patent: Nov. 10, 1998

[54] ARCING FAULT DETECTOR TESTING AND DEMONSTRATION SYSTEM

[76] Inventors: Stanley J. Brooks, 5191 Windrow Rd., Rockvale, Tenn. 37153; Charles E. Reneau, 2423 Sawmill St., Murfreesboro, Tenn. 37128

[21] Appl. No.: 719,972

[22] Filed: Sep. 24, 1996

[51] Int. Cl.[6] .................................................. H02B 1/04
[52] U.S. Cl. ......................... 324/424; 324/536; 324/423
[58] Field of Search .............................. 361/42; 324/424, 324/418, 509, 423, 536

[56] References Cited

U.S. PATENT DOCUMENTS

| | | |
|---|---|---|
| H536 | 10/1988 | Strickland et al. . |
| Re. 30,678 | 7/1981 | Van Zeeland et al. . |
| 2,808,566 | 10/1957 | Douma . |

(List continued on next page.)

FOREIGN PATENT DOCUMENTS

| | | |
|---|---|---|
| 0 615 327 | 9/1994 | European Pat. Off. . |
| 0 649 207 A1 | 4/1995 | European Pat. Off. . |
| 762 591 A2 | 3/1997 | European Pat. Off. . |
| 0 802 602 A2 | 10/1997 | European Pat. Off. . |
| WO 97/30501 | 8/1997 | WIPO . |

OTHER PUBLICATIONS

Antonio N. Paolantonio, P.E., *Directional Couplers*, R. F. Design, Sep./Oct., 1979, pp. 40–49.

Alejandro Duenas, J., *Directional Coupler Design Graphs for Parallel Coupled Lines and Interdigitated 3 dB Couplers*, RF Design, Feb., 1986, pp. 62–64.

Jean–Francois Joubert, *Feasibility of Main Service Ground–Fault Protection On The Electrical Service To Dwelling Units*, Consultants Electro–Protection Inc., 1980, Michelin St., Laval, Quebec H7L 9Z7, Oct. 26, 1990, pp. 1–77.

B. D. Russell, *Detection Of Arcing Faults On Distribution Feeders*, Texas A & M Research Foundation, Box H, College Station, Texas 77843, Final Report Dec., 1982, pp. pp. 1–B18.

*Primary Examiner*—Ernest F. Karlsen
*Assistant Examiner*—Jose M. Solis
*Attorney, Agent, or Firm*—Larry I. Golden; Kareem M. Irfan

[57] ABSTRACT

An apparatus for demonstrating and testing the operation of an arcing fault detector. The apparatus comprises an electrical circuit including line and neutral conductors connected between a power source and a load. A selector switch is movable between a first position and a second position in order to selectively route load current across either an arcing fault detector or standard circuit breaker. A pair of electrodes is positioned between said selector switch and the load for producing an arcing condition on the line conductor. The arcing fault detector preferably comprises a sensor for monitoring the rate of change of electrical current on the line conductor and producing a rate-of-change signal, a means for producing a pulse each time the rate-of-change signal exceeds a selected threshold, a means for filtering the rate-of-change signal and/or pulse to eliminate signals or pulses representing changes in electrical current outside a selected frequency range, a means for producing a count signal representing a number of unfiltered pulses occurring within a selected time interval, and a means for generating a trip signal in response to the count signal exceeding a trip threshold level indicative of an arcing fault condition.

23 Claims, 9 Drawing Sheets

U.S. PATENT DOCUMENTS

| | | |
|---|---|---|
| 2,832,642 | 4/1958 | Lennox . |
| 3,471,784 | 10/1969 | Arndt et al. . |
| 3,538,241 | 11/1970 | Rein . |
| 3,588,611 | 6/1971 | Lambden et al. . |
| 3,600,502 | 8/1971 | Wagenaar et al. . |
| 3,622,872 | 11/1971 | Boaz et al. . |
| 3,684,955 | 8/1972 | Adams . |
| 3,746,930 | 7/1973 | Van Best et al. . |
| 3,775,675 | 11/1973 | Freeze et al. . |
| 3,858,130 | 12/1974 | Misencik . |
| 3,869,665 | 3/1975 | Kenmochi et al. . |
| 3,878,460 | 4/1975 | Nimmersjo . |
| 3,911,323 | 10/1975 | Wilson et al. . |
| 3,914,667 | 10/1975 | Waldron . |
| 3,939,410 | 2/1976 | Bitsch et al. . |
| 4,074,193 | 2/1978 | Kohler . |
| 4,081,852 | 3/1978 | Coley et al. . |
| 4,087,744 | 5/1978 | Olsen . |
| 4,169,260 | 9/1979 | Bayer . |
| 4,214,210 | 7/1980 | O'Shea . |
| 4,245,187 | 1/1981 | Wagner et al. . |
| 4,251,846 | 2/1981 | Pearson et al. . |
| 4,264,856 | 4/1981 | Frierdich et al. . |
| 4,316,187 | 2/1982 | Spencer . |
| 4,354,154 | 10/1982 | Olsen . |
| 4,387,336 | 6/1983 | Joy et al. . |
| 4,459,576 | 7/1984 | Fox et al. . |
| 4,466,071 | 8/1984 | Russell, Jr. . |
| 4,639,817 | 1/1987 | Cooper et al. . |
| 4,642,733 | 2/1987 | Schacht . |
| 4,644,439 | 2/1987 | Taarning . |
| 4,697,218 | 9/1987 | Nicolas . |
| 4,707,759 | 11/1987 | Bodkin . |
| 4,771,355 | 9/1988 | Emery et al. . |
| 4,810,954 | 3/1989 | Fam . |
| 4,845,580 | 7/1989 | Kitchens . |
| 4,853,818 | 8/1989 | Emery et al. . |
| 4,858,054 | 8/1989 | Franklin . |
| 4,866,560 | 9/1989 | Allina . |
| 4,882,682 | 11/1989 | Takasuka et al. . |
| 4,893,102 | 1/1990 | Bauer . |
| 4,901,183 | 2/1990 | Lee . |
| 4,922,368 | 5/1990 | Johns . |
| 4,931,894 | 6/1990 | Legatti . |
| 4,949,214 | 8/1990 | Spencer . |
| 5,047,724 | 9/1991 | Boksiner et al. . |
| 5,121,282 | 6/1992 | White . |
| 5,168,261 | 12/1992 | Weeks ................................. 324/424 |
| 5,185,684 | 2/1993 | Beihoff et al. . |
| 5,185,685 | 2/1993 | Tennies et al. . |
| 5,185,686 | 2/1993 | Hansen et al. . |
| 5,185,687 | 2/1993 | Beihoff et al. . |
| 5,206,596 | 4/1993 | Beihoff et al. . |
| 5,208,542 | 5/1993 | Tennies et al. . |
| 5,223,795 | 6/1993 | Blades . |
| 5,224,006 | 6/1993 | MacKenzie et al. . |
| 5,257,157 | 10/1993 | Epstein . |
| 5,280,404 | 1/1994 | Ragsdale . |
| 5,286,933 | 2/1994 | Pham ................................. 324/424 |
| 5,307,230 | 4/1994 | MacKenzie . |
| 5,334,939 | 8/1994 | Yarbrough ......................... 324/424 |
| 5,359,293 | 10/1994 | Boksiner et al. . |
| 5,363,269 | 11/1994 | McDonald ............................ 361/42 |
| 5,383,084 | 1/1995 | Gershen et al. . |
| 5,388,021 | 2/1995 | Stahl . |
| 5,434,509 | 7/1995 | Blades . |
| 5,448,443 | 9/1995 | Muelleman . |
| 5,459,630 | 10/1995 | MacKenzie et al. . |
| 5,510,946 | 4/1996 | Franklin . |
| 5,568,371 | 10/1996 | Pitel et al. . |
| 5,602,709 | 2/1997 | Al-Dabbagh . |
| 5,659,453 | 8/1997 | Russell et al. . |
| 5,691,869 | 11/1997 | Engel et al. . |

ARCING FAULT DETECTOR TESTING AND DEMONSTRATION SYSTEM

FIELD OF THE INVENTION

The present invention relates generally to devices which detect hazardous arcing fault conditions in electric circuits and, more particularly, to a device for testing and/or demonstrating an arcing fault detector in relation to a standard circuit breaker.

BACKGROUND OF THE INVENTION

Electrical systems in residential, commercial and industrial applications usually include a panelboard for receiving electrical power from a utility source. To reduce the risk of injury or fire, the power is generally routed through overcurrent protection devices to designated branch circuits supplying one or more loads. The overcurrent protection devices are typically circuit interrupters such as circuit breakers and fuses which are designed to interrupt the electrical current supplied to the loads if the limits of the conductors are surpassed.

Circuit breakers are a preferred type of circuit interrupter because a resetting mechanism allows their reuse. Typically, circuit breakers interrupt an electric circuit due to a disconnect or trip condition such as a current overload or ground fault. The current overload condition results when a current exceeds the continuous rating of the breaker for a time interval determined by the trip current. The ground fault trip condition is created by an imbalance of currents flowing between a line conductor and a neutral conductor such as a grounded conductor, a person causing a current path to ground, or an arcing fault to ground.

However, arcing faults are often undetected by standard circuit breakers. An arcing fault is defined as current through ionized gas between two ends of a broken conductor, between two conductors supplying a load, or between a conductor and ground. Upon occurrence of an arcing fault, branch or load impedance may cause the current levels to be reduced to a level below the trip curve settings of the circuit breaker, causing the arcing fault condition to be undetected by the circuit breaker. In addition, an arcing fault which does not contact a grounded conductor or person will not trip a ground fault protected circuit.

There are many conditions that may cause an arcing fault. For example, corroded, worn or aged wiring or insulation, loose connections, wiring damaged by nails or staples through the insulation, and electrical stress caused by repeated overloading, lightning strikes, etc. These faults may damage the conductor insulation and reach an unacceptable temperature. Arcing faults can cause fire if combustible materials are in close proximity.

There are also many conditions that may cause a "false" arcing fault. For example, the occurrence of an arcing fault in one branch circuit of an electrical distribution system may cause a false arcing fault signal in another branch circuit as a series path is created between the branch circuits through a load center. As a result, circuit interrupters in more than one branch circuit may be erroneously tripped. Another condition that may cause a false arcing fault is a "noisy" load such as an arc welder, electric drill, etc. producing a high frequency disturbance in the electrical circuit which appears to be an arcing fault.

There are several devices in the prior art designed to detect hazardous arcing faults. In addition to detecting arcing faults which otherwise would have been ignored by conventional circuit breakers, the arcing fault detector should preferably be capable of distinguishing arcing faults from high frequency disturbances caused by normal operation of noisy loads, and further should be capable of isolating an arcing fault signal to the particular branch circuit in which the arcing fault occurred, thus preventing "false" arcing fault indications in other branch circuits.

In order to teach the dangers of arcing faults and the associated benefits provided by arcing fault detectors, there is a need for a system to facilitate demonstration and testing of the arcing fault detector in relation to that of a standard circuit breaker. The present invention is directed to providing such a system. It is capable of producing an arcing current between two electrodes connected to a line conductor, demonstrating that a standard circuit breaker does not trip in response to the presence of the arcing condition, and demonstrating that the arcing fault detector trips in response to the same arcing condition. The apparatus is capable of being enclosed within a portable box to facilitate demonstration in a conference room, classroom or other similar environment.

SUMMARY OF THE INVENTION

In accordance with one aspect of the present invention, there is provided a system for demonstrating or testing the operation of an arcing fault detector comprising an electrical circuit including line and neutral conductors connected between a power source and a load, the line conductor carrying an electrical signal between the power source and the load. A selector switch is positioned between the power source and the load and movable between a first position and a second position. An arcing fault detector and associated line interrupter is connected to the line conductor between the power source and the selector switch. A standard circuit breaker is connected in parallel to the arcing fault detector. When the selector switch is in the first position, the electrical signal is provided to the arcing fault detector rather than the standard circuit breaker. When the selector switch is in the second position, the electrical signal is provided to the standard circuit breaker rather than the arcing fault detector. A pair of electrodes is positioned between the selector switch and the load for producing an arcing condition on the line conductor.

In accordance with another aspect of the present invention, there is provided a system for demonstrating or testing the operation of an arcing fault detector comprising an electrical circuit including line and neutral conductors connected between a power source and a load, the line conductor carrying an electrical signal between the power source and the load. A pair of electrodes are positioned between the power source and the load for producing an arcing condition on the line conductor. A line interrupter is provided for interrupting the electrical signal between the power source and the load in response to receiving a trip signal. An arcing fault detector and a standard circuit breaker are connected to the line conductor between the power source and the pair of electrodes. The arcing fault detector produces a trip signal upon detection of an arcing fault on the line conductor, while the standard circuit breaker produces a trip signal upon detection of an overcurrent condition on the line conductor. Upon the occurrence of a trip signal, indicator means are provided for indicating whether the trip signal was produced by the arcing fault detector or the standard circuit breaker.

BRIEF DESCRIPTION OF THE DRAWINGS

The foregoing and other advantages of the invention will become apparent upon reading the following detailed description and upon reference to the drawings in which.

Figure 1:
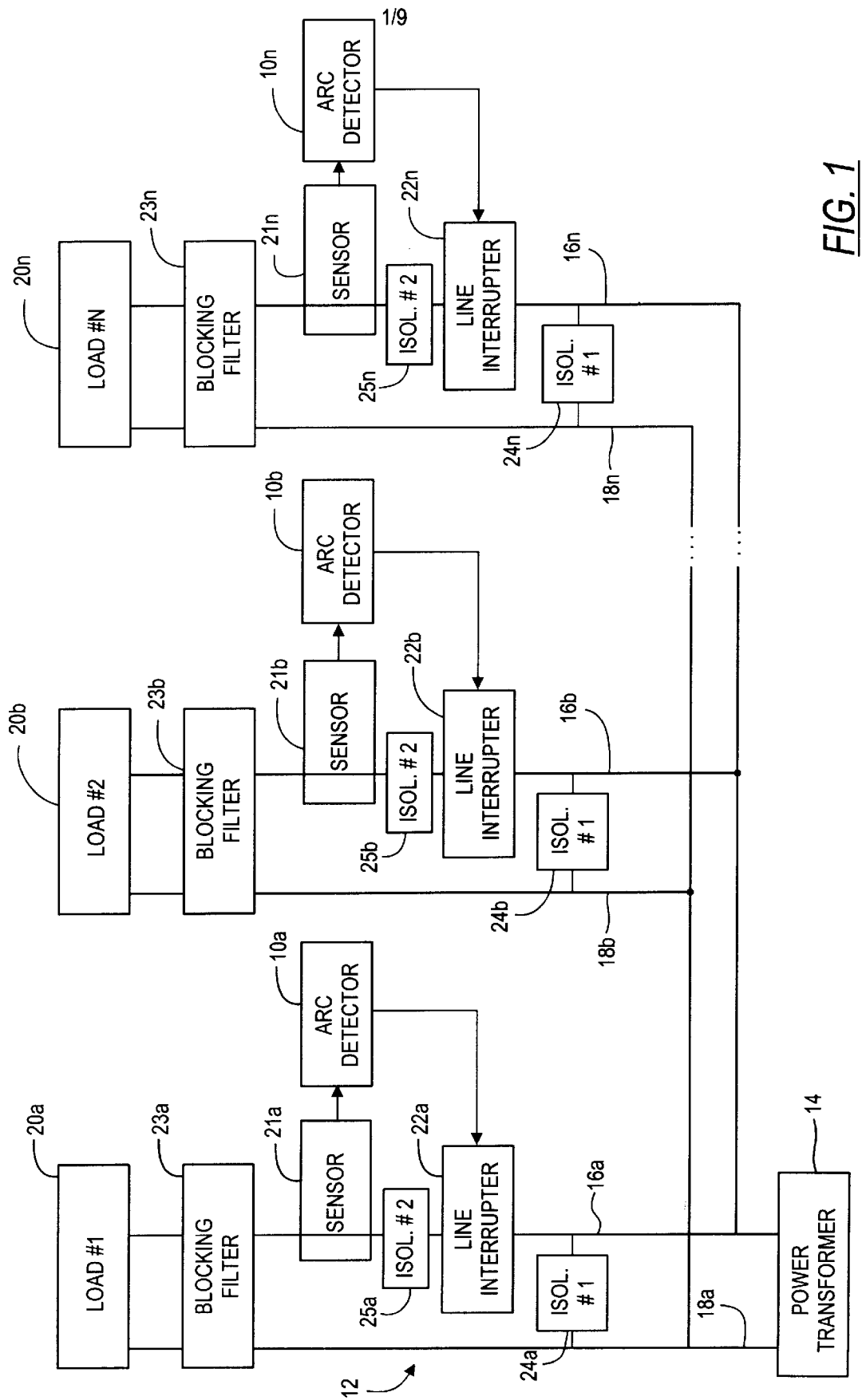
FIG. 1 is a block diagram of an arcing fault detector system using a type of arcing fault detector which may be used in the demonstrator apparatus embodying the present invention.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents, and alternatives falling within the spirit and scope of the invention as defined by the appended claims.

DESCRIPTION OF SPECIFIC EMBODIMENTS

Turning now to the drawings and referring initially to FIG. 1, arcing fault detectors 10a, 10b . . . 10n are connected to n branches of an electrical distribution system 12 having a utility company power transformer 14 as a source of electric power. The electrical distribution system 12 includes line conductors 16a, 16b . . . 16n and neutral conductors 18a, 18b . . . 18n which distribute electrical power to loads 20a, 20b . . . 20n through corresponding sensors 21a, 21b . . . 21n, line interrupters 22a, 22b . . . 22n, and blocking filters 23a, 23b . . . 23n. The line conductors 16 and a neutral conductors 18 are typically at 240 volts or 120 volts, and a frequency of 60 Hz.

Each of the line interrupters 22 is preferably a circuit breaker which includes an overload trip mechanism having a thermal/magnetic characteristic which trips the breaker contacts to an open circuit condition in response to a given overload condition, to disconnect the corresponding load 20 from the power source, as is known in the art. It is also known to provide the circuit breaker 22 with ground fault interrupter circuitry responding to a line or neutral-to-ground fault to energize a trip solenoid which trips the circuit breaker and opens the contacts.

The sensors 21 monitor the rate of change of electrical current in the respective line conductors 16 and produce signals representing the rate of change. The rate-of-change signal from each sensor 21 is supplied to the corresponding arc detector 10, which produces a pulse each time the rate-of-change signal increases above a selected threshold. The rate-of-change signal and/or the pulses produced therefrom are filtered to eliminate signals or pulses outside a selected frequency range. The final pulses are then monitored to detect when the number of pulses that occur within a selected time interval exceeds a predetermined threshold. In the event that the threshold is exceeded, the detector 10 generates an arc-fault-detection signal that can be used to trip the corresponding line interrupter 22.

The pattern of fluctuations in the rate-of-change signal produced by the sensor 21 indicates whether the condition of the circuit is a normal load, a normal switching event, a phase-controlled fired load, or an arcing fault event. One example of a suitable sensor for producing the desired rate-of-change signal is a toroidal sensor having an annular core encompassing the current-carrying load line, with the sensing coil wound helically on the core. The core is made of magnetic material such as a ferrite, iron, or molded permeable powder capable of responding to rapid changes in flux. A preferred sensor uses a ferrite core wound with 200 turns of 24–36 gauge copper wire to form the sensing coil. An air gap may be cut into the core to reduce the permeability to about 30. The core material preferably does not saturate during the relatively high currents produced by parallel arcs, so that arc detection is still possible at those high current levels.

Other means for sensing the rate of change of the current in a line conductor are contemplated by the present invention. By Faraday's Law, any coil produces a voltage proportional to the rate of change in magnetic flux passing through the coil. The current associated with an arcing fault generates a magnetic flux around the conductor, and the coil of the sensor 21 intersects this flux to produce a signal. Other suitable sensors include a toroidal transformer with a core of magnetic material or an air core, an inductor or a transformer with a laminated core of magnetic material, and inductors mounted on printed circuit boards. Various configurations for the sensor core are contemplated by the present invention and include toroids which have air gaps in their bodies.

Preferably, the rate-of-change signal produced by the sensor 21 represents only fluctuations in the rate of change within a selected frequency band. The sensor bandpass characteristic is preferably such that the lower frequency cut-off point rejects the power frequency signals, while the upper frequency cut-off point rejects the high frequency signals generated by noisy loads such as a solder gun, electric saw, electric drill, or like appliances, equipment, or tools. The resulting output of the sensor 21 is thus limited to the selected frequency band associated with arcing faults, thereby eliminating or reducing spurious fluctuations in the rate-of-change signal which could result in nuisance tripping. As an example, the sensor bandpass characteristic may have: (1) a lower frequency cut-off point or lower limit of 60 Hz so as to reject power frequency signals, and (2) an upper frequency cut-off point or upper limit of approximately 1 MHz so as to effectively reject high frequency signals associated with noisy loads. These specific frequency cut-off points for the sensor bandpass characteristic are by way of example only, and other appropriate frequency cut-off limits may be adopted depending upon actual frequency ranges for the power signals as well as the noisy load signals.

The desired bandpass characteristic is realized by appropriately selecting and adjusting the self-resonant frequency of the sensor. The current-type sensor is selected to have a predetermined self-resonant frequency which defines associated upper and lower frequency cut-off or roll-off points for the operational characteristics of the sensor. Preferably, the current-type sensor is designed to exhibit the desired bandpass filtering characteristic as it operates to detect the rate of change of current variations within the load line being monitored. The present invention contemplates other means for bandpass filtering the signal output within the selected frequency band. For example, a bandpass filter or a combination of filters in a circuit can be used to attenuate frequencies above or below the cut-off points for the selected frequency band.

Figure 2:
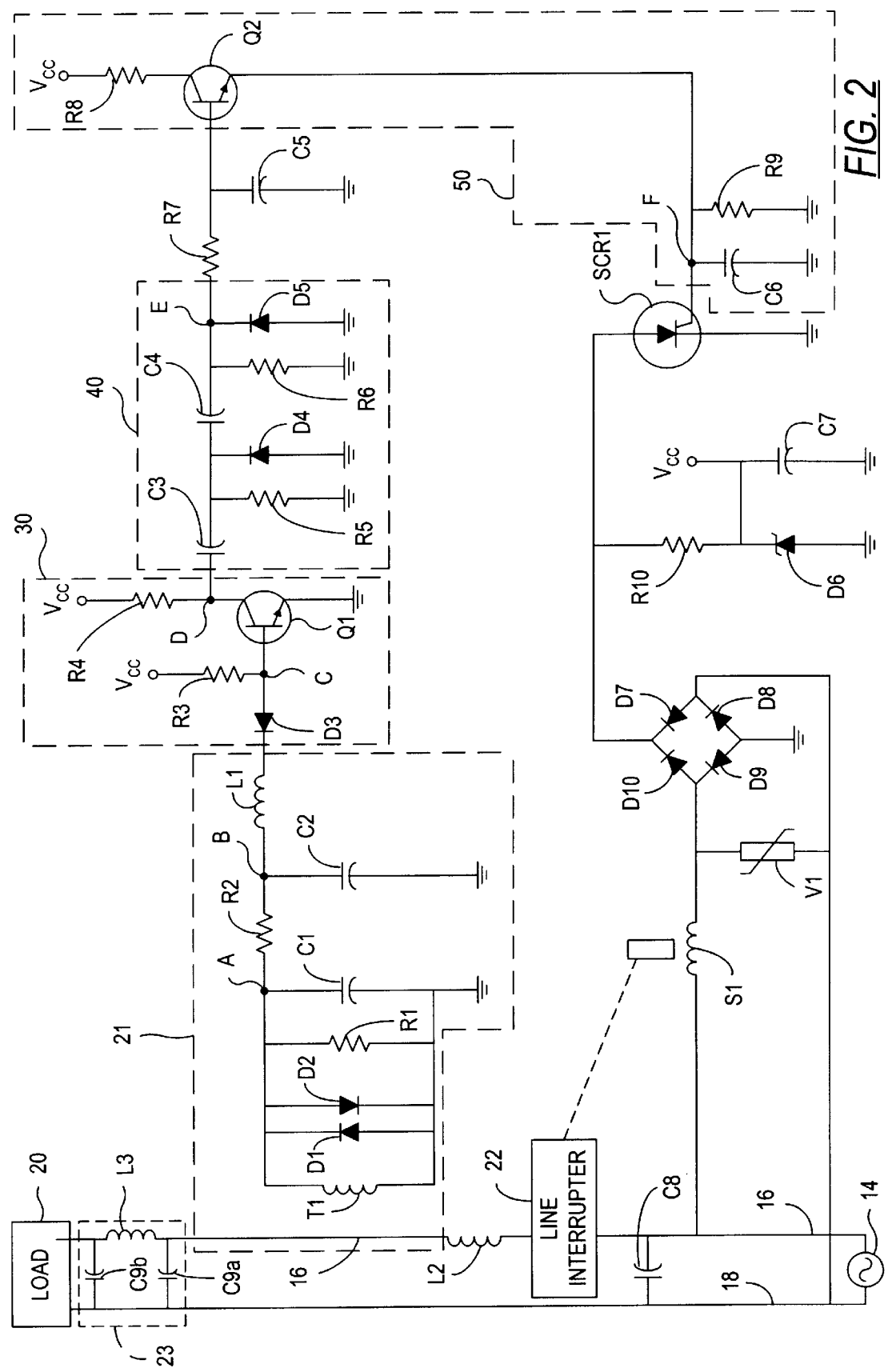
FIG. 2 is a schematic diagram of an electrical circuit for implementing the arcing fault detector system illustrated in FIG. 1.

FIG. 2 illustrates a preferred circuit for one of the arc detectors 10. The sensor 21 produces the desired rate-of-change signal (commonly referred to as a "di/dt signal") in the form of an output voltage which is connected to a comparator circuit 30 through a filtering network in the sensor and a diode D3. The rate-of-change signal originates in the sensor coil T1 which is wound on a core surrounding the load line 16. Connected in parallel with the sensor coil T1 are a pair of diodes D1 and D2 which serve as clamping devices during high-power transient conditions. A resistor R1 in parallel with the diodes D1 and D2 dampens self-ringing of the sensor, during high-power transients. A pair of capacitors C1 and C2 in parallel with the resistor R1, and a resistor R2 and an inductor L1 connected in series to the input to the comparator 30, are tuned to assist in attaining the desired rolloff characteristics of the filtering network formed thereby. For example, with the illustrative values listed below for the components of the circuit of FIG. 2, the sensor has a passband extending from about 10 KHz to about 100 KHz, with sharp rolloff at both sides of the passband.

Figure 3A:
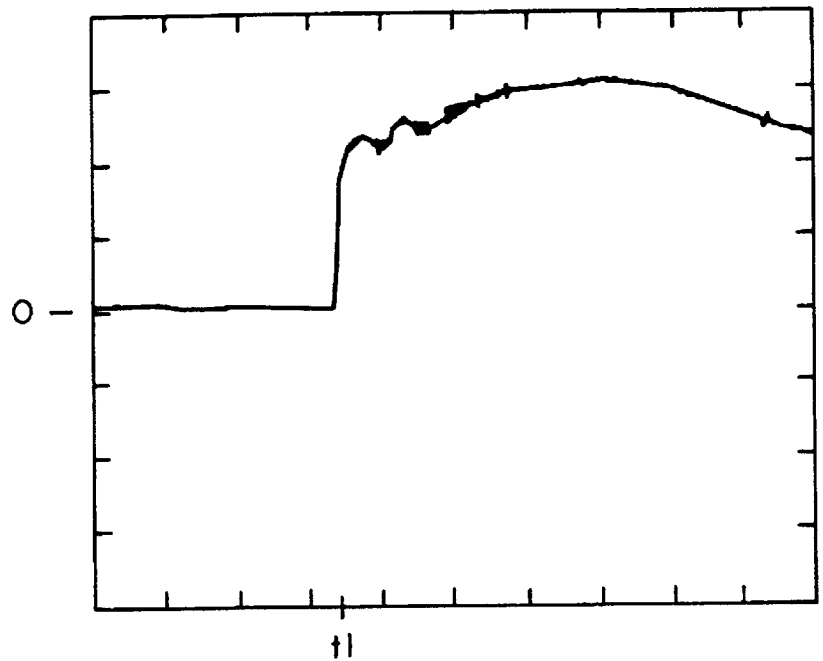
FIGS. 3a through 3g are waveforms at various points in the circuit of FIG. 2.
Figure 3B:
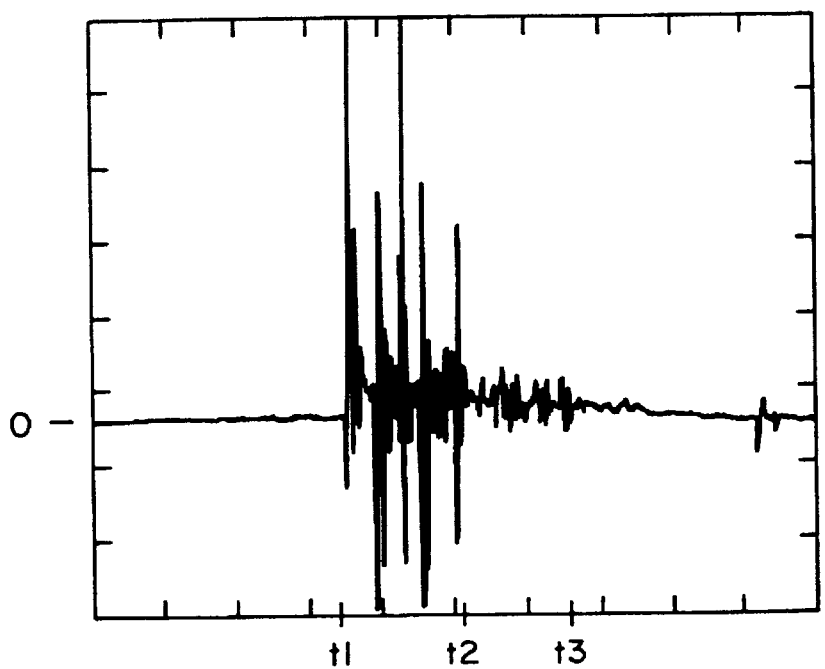

The operation of the circuit of FIG. 2 can be more clearly understood by reference to the series of waveforms in FIGS. 3a through 3g. FIG. 3a is an actual waveform from an oscilloscope connected to a line conductor 16 carrying a-c. power at 60 Hz and experiencing a high-frequency disturbance beginning at time t1. Because the high-frequency disturbance is within the frequency range to which the sensor 21 is sensitive (e.g., from about 10 KHz to about 100 KHz), the disturbance results in a burst of high-frequency noise in the di/dt output signal (FIG. 3b) from the sensor 21 (at point A in the circuit of FIG. 2), beginning at time t1. The noise burst has a relatively high amplitude from time t1 until approximately time t2, and then continues at a low amplitude from time t2 to about time t3.

In the comparator 30, the magnitude of the rate-of-change signal from the sensor 21 is compared with the magnitude of a fixed reference signal, and the comparator 30 produces an output voltage only when the magnitude of the rate-of-change signal crosses that of the reference signal. This causes the detector 10 to ignore low-level signals generated by the sensor 21. All signals having a magnitude above the threshold level set by the magnitude of the reference signal are amplified to a preset maximum value to reduce the effect of a large signal. In the comparator 30, a transistor Q1 is normally turned on with its base pulled high by a resistor R3. A diode D3 changes the threshold and allows only the negative pulses from the sensor 21 to be delivered to the base of transistor Q1. When the signal to the comparator drops below the threshold level (minus 0.2 volt for the circuit values listed below), this causes the transistor Q1 to turn off. This causes the collector of the transistor Q1 to rise to a predetermined voltage, determined by the supply voltage $V_{cc}$, a resistor R4 and the input impedance of a single-shot pulse generator circuit 40. This collector voltage is the output of the comparator circuit 30. The collector voltage remains high as long as the transistor Q1 is turned off, which continues until the signal from the sensor 21 rises above the threshold level again. The transistor Q1 then turns on again, causing the collector voltage to drop. The end result is a pulse output from the comparator, with the width of the pulse corresponding to the time interval during which the transistor Q1 is turned off, which in turn corresponds to the time interval during which the negative-going signal from the sensor 21 remains below the threshold level of the comparator.

The arcing fault detection system 10 can also include a filter 40 for blocking false arcing fault signals or other nuisance output signals generated by normal operation of the load 20. The blocking filter 40 is connected between the sensor 30 and the load 20 on each branch circuit to prevent the false arcing fault signals from being delivered to the sensor 30. As seen in FIG. 1, capacitors 42 connect the load line 24 to the neutral line 26 on each branch circuit. An inductor 44 is connected to the load line 24 between the connections of the two capacitors 42 to the load line 24.

Figure 3C:
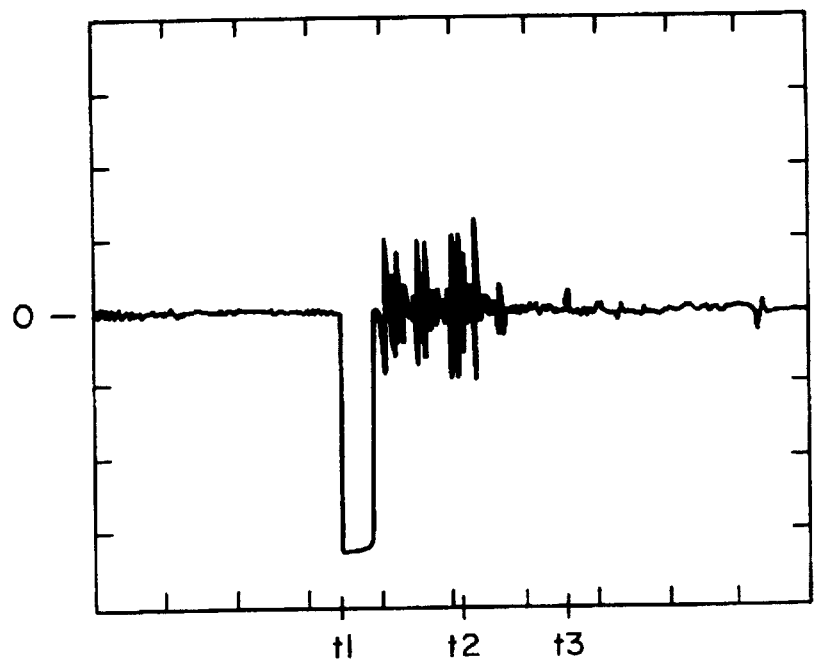
Figure 3D:
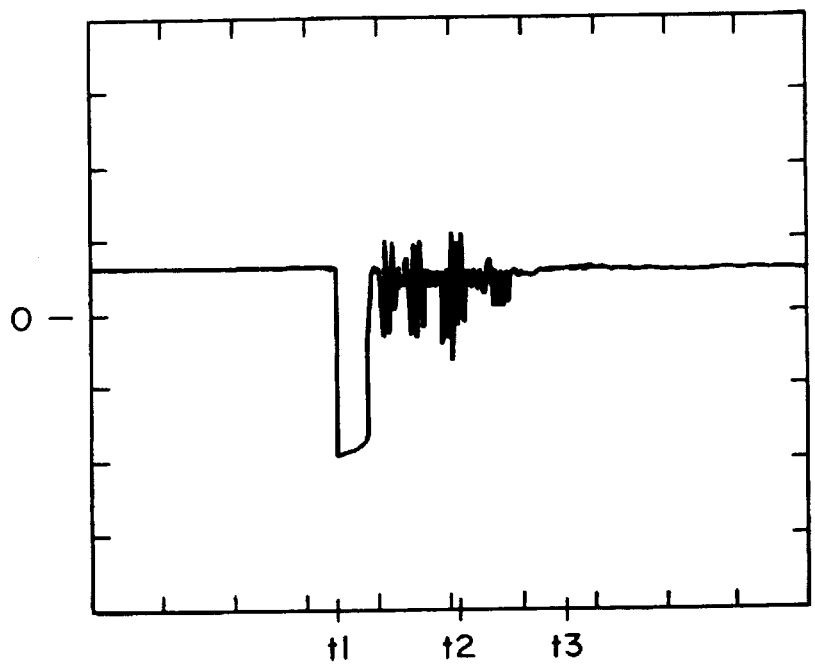

The noise burst in the sensor output is filtered to produce the waveform shown in FIG. 3c at point B in the circuit of FIG. 2. The waveform at point C in the circuit of FIG. 2 is shown in FIG. 3d, and it can be seen that the amplitude has been reduced and a d-c. offset has been introduced by summing the filtered di/dt signal with a d-c. bias from the supply voltage $V_{cc}$ at point C. This is the input signal to the base of the transistor Q1.

Figure 3E:
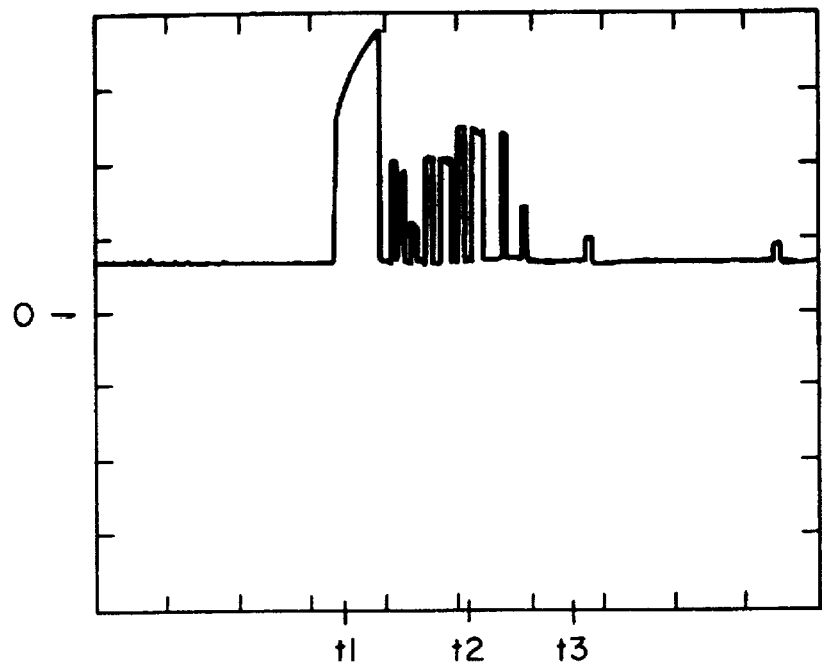

The output of the transistor Q1 is a series of positive-going pulses corresponding to the negative-going peaks in the input signal. The transistor output, at point D in the circuit of FIG. 2, is shown in FIG. 3e. It can be seen that the transistor circuit functions as a comparator by producing output pulses corresponding only to negative-going peaks that exceed a certain threshold in the filtered di/dt signal shown in FIG. 3c. At this point in the circuit, the pulses vary in both width and amplitude, as can be seen in FIG. 3e.

To convert the output pulses of the comparator 30, which vary in both width and amplitude, into a series of pulses of substantially constant width and amplitude, the comparator output is fed to a single-shot pulse generator circuit 40. This high-pass filter circuit includes a pair of capacitors C3 and C4 connected in series to the collector of the transistor Q1, and two resistor-diode pairs connected in parallel from opposite sides of the capacitor C4 to ground. The pulses produced by this circuit will be described in more detail below in connection with the waveforms shown in FIG. 3. The output pulses are predominantly pulses of equal width and amplitude, although occasional larger or smaller pulses can result from especially large or small input pulses.

Figure 3F:
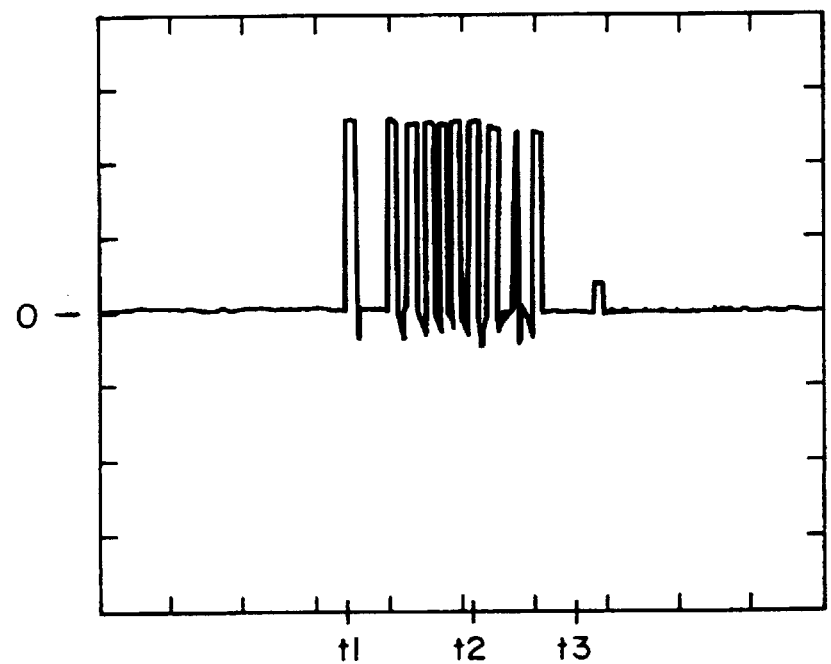

The variable-width and variable-amplitude pulses of FIG. 3e are converted to a series of pulses of substantially constant width and amplitude by the single-shot pulse generator circuit 40. The output of this circuit 40, at point E in the circuit of FIG. 2, is shown in FIG. 3f. Although all the pulses shown in FIG. 3f are of substantially the same size, larger or smaller pulses may be produced by di/dt spikes that are excessively large or excessively small. The vast majority of the pulses at point E, however, are substantially independent of the amplitude and duration of the corresponding spikes in the di/dt signal, provided the spikes are large enough to produce an output pulse from the comparator 30.

The substantially uniform pulses produced by the circuit 40 are supplied to the base of a transistor Q2 through a current-limiting resistor R7. A capacitor C5 connected from the transistor base to ground improves the sharpness of the roll-off of the bandpass filtering. The transistor Q2 is the beginning of an integrator circuit 50 that integrates the pulses produced by the circuit 40. The pulses turn the transistor on and off to charge and discharge a capacitor C6 connected between the transistor emitter and ground. A resistor R9 is connected in parallel with the capacitor C6, and a resistor R8 connected between the supply voltage and the collector of the transistor Q2 determines the level of the charging current for the capacitor C6. The magnitude of the charge on the capacitor C6 at any given instant represents the integral of the pulses received over a selected time interval. Because the pulses are substantially uniform in width and amplitude, the magnitude of the integral at any given instant is primarily a function of the number of pulses received within the selected time interval immediately preceding that instant. Consequently, the value of the integral can be used to determine whether an arcing fault has occurred.

Figure 3G:
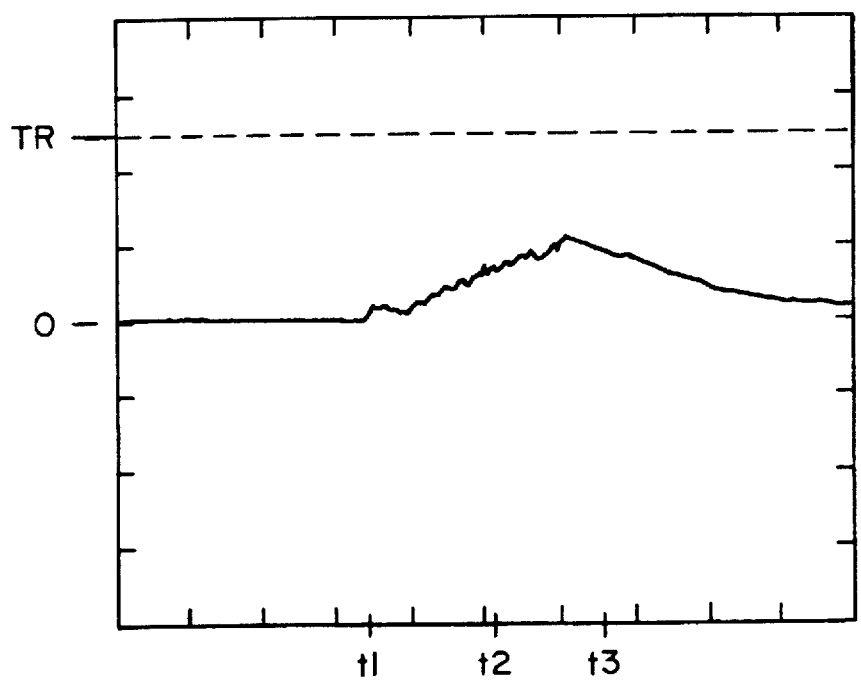

The integral signal produced by the circuit 50 is shown in FIG. 3g, taken at point F in the circuit of FIG. 2. It can be seen that the integrator circuit charges each time it receives a pulse from the circuit 40, and then immediately begins to discharge. The charge accumulates only when the pulses appear at a rate sufficiently high that the charge produced by one pulse is less than the discharge that occurs before the next pulse arrives. If the pulses arrive in sufficient number and at a sufficient rate to increase the integral signal to a trip threshold level TR (FIG. 3g), SCR1 is triggered to trip the circuit breaker. The circuit is designed so that this occurs only response to a di/dt signal representing an arcing fault.

When SCR1 is turned on, a trip solenoid S1 is energized to disconnect the load from the circuit in the usual manner. Specifically, turning on SCR1 causes current to flow from line to neutral through a diode bridge formed by diodes D7–D10, thereby energizing the solenoid to open the circuit breaker contacts in the line 16 and thereby disconnect the protected portion of the system from the power source. The d-c. terminals of the diode bridge are connected across SCR1, and the voltage level is set by a zener diode D6 in series with a current-limiting resistor R10. A varistor V1 is connected across the diode bridge as a transient suppressor. A filtering capacitor C7 is connected across the zener diode D6. The trip circuit loses power when the circuit breaker contacts are opened, but of course the contacts remain open until reset.

One example of a circuit that produces the desired result described above is the circuit of FIG. 2 having the following values:

D1
  1N4148
D2
  1N4148
D3
  1N4148
D4
  1N4148
D5
  1N4148
D6
  27 v zener
R1
  3.01K
R2
  1.3K
R3
  174K
R4
  27.4K
R5
  10K
R6
  10K
R7
  10K
R8
  4.2K
R9
  4.75K
R10
  24K
L1
  3300 uH
L2
  500 uH
L3
  500 uH
C1
  0.012 uF
C2
  0.001 uF
C3
  0.001 uF
C4
  0.001 uF
C5
  0.001 uF
C6
  6.8 uF
C7
  1.0 uF
C8
  1.0 uF
Q1
  2N2222 A
Q2
  2N2222 A
SCR1
  CR08AS-12 made by POWEREX-Equal
$V_{cc}$
  27 v Although a circuit breaker is the most commonly used line interrupter, the output device may be a comparator, SCR, relay, solenoid, circuit monitor, computer interface, lamp, audible alarm, etc.

It will be understood that a number of modifications may be made in the circuit of FIG. 2. For example, the discrete bandpass filter between the sensor and the comparator can be replaced with an active filter using an operational amplifier. As another example, a single-shot timer can be used in place of the single-shot pulse generator in the circuit of FIG. 2. This circuit can receive the output signal from an active filter as the trigger input to an integrated-circuit timer, with the output of the timer supplied through a resistor to the same integrator circuit formed by the resistor R9 and capacitor C6 in the circuit of FIG. 2.

Figure 4:
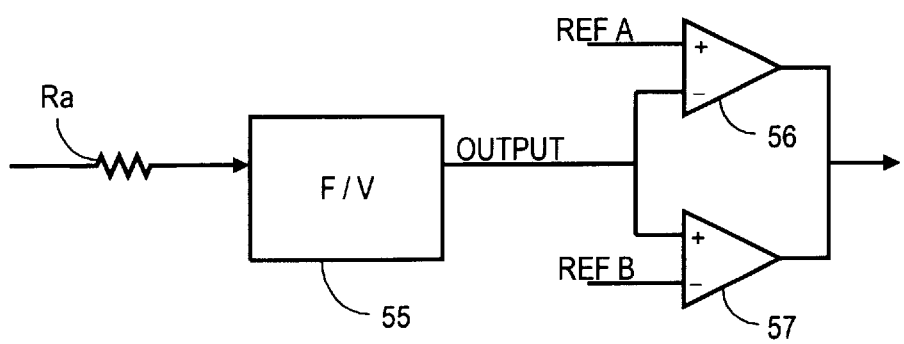
FIG. 4 is a schematic diagram of an alternate circuit for use in place of the comparator and single-shot pulse generator in the circuit of FIG. 2.

FIG. 4 illustrates a frequency-to-voltage converter circuit that can be used in place of all the circuitry between point A and the integrator circuit in FIG. 2. In this circuit, the signal from point A in FIG. 2 is supplied through a resistor Ra to a frequency/voltage converter integrated circuit 55 such as an AD537 made by Analog Devices Inc. The output of the integrated circuit 55 is fed to a pair of comparators 56 and 57 that form a conventional window comparator. Specifically, the output of the circuit 55 is applied to the inverting input of a comparator 56 and to the non-inverting input of a comparator 57. The other inputs of the comparators 56 and 57 receive two different reference signals A and B which set the limits of the window, i.e., the only signals that pass through the window comparator are those that are less than reference A and greater than reference B.

Figure 5:
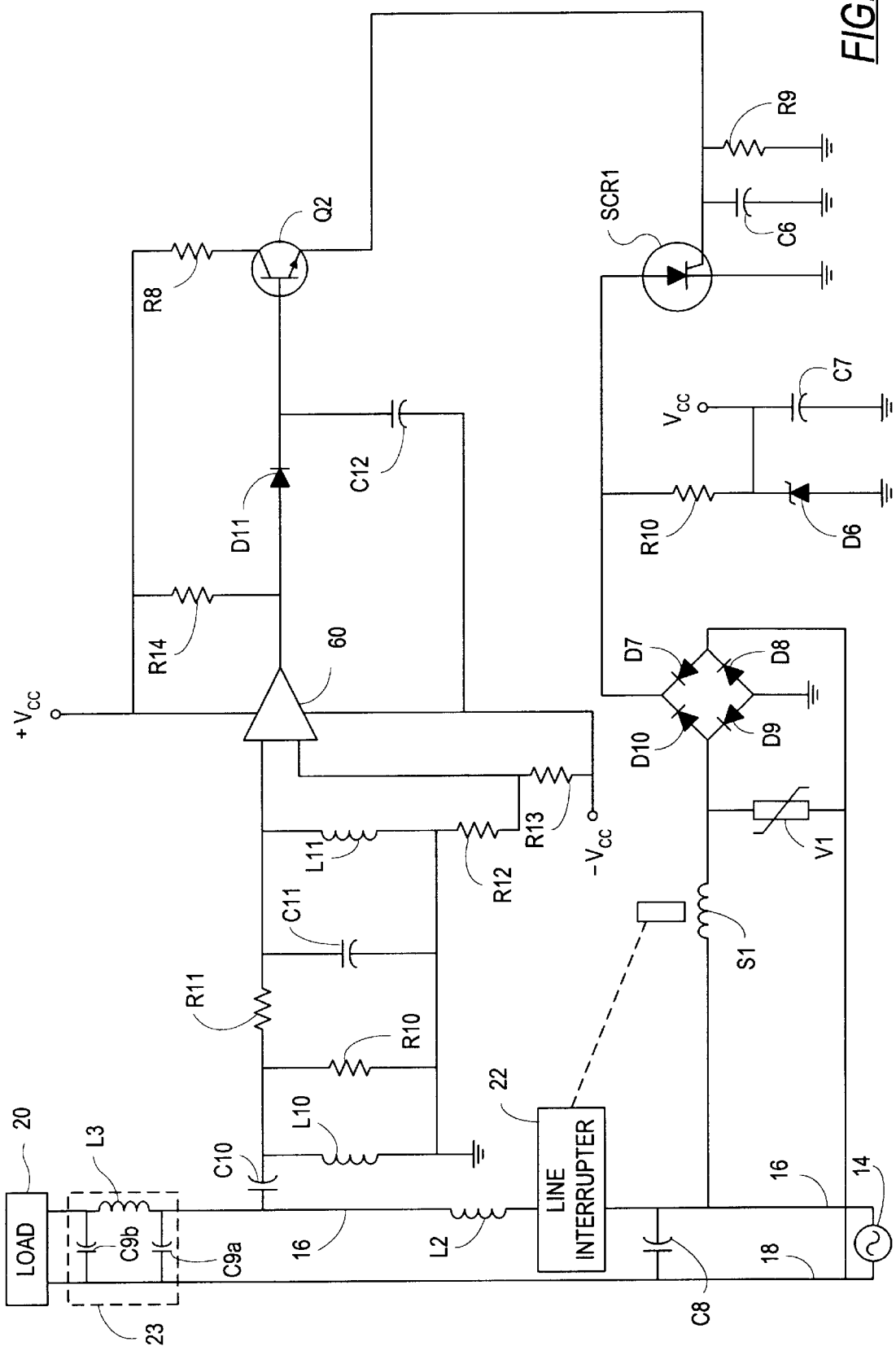
FIG. 5 is a schematic diagram of an alternative circuit for implementing the fault detection system illustrated in FIG. 1.

FIG. 5 illustrates an arc detector 10 for sensing the rate of change of the line voltage, i.e., dv/dt, rather than current. The sensor in this circuit is a capacitor C10 connected between a line conductor 16 and an inductor L10 leading to ground. The inductor L10 forms part of a bandpass filter that passes only those signals falling within the desired frequency band, e.g., between 10 KHz and 100 KHz. The filter network also includes a resistor R10, a capacitor C11 and a second inductor L11 in parallel with the first inductor L10, and a resistor R11 connected between the resistor R10 and the capacitor C11. The resistor R10 dampens the ringing between the capacitor C10 and the inductor L10, and the resistor R11 adjusts the threshold or sensitivity of the circuit. The inductors L10 and L11 provide low-frequency roll-off at the upper end of the pass band, and a capacitor C11 provides the high-frequency roll-off at the lower end of the pass band.

The capacitor C10 may be constructed by attaching a dielectric to the line bus so that the bus forms one plate of the capacitor. The second plate of the capacitor is attached on the opposite side of the dielectric from the bus. The sensor circuit is connected to the second plate.

The output of the bandpass filter described above is supplied to a comparator 60 to eliminate signals below a selected threshold, and to limit large signals to a preselected maximum amplitude. The filter output is applied to the inverting input of the comparator 60, through the resistor R11, while the non-inverting input receives a reference signal set by a voltage divider formed by a pair of resistors R12 and R13 connected between $V_{cc}$ and ground. The comparator 60 eliminates very low levels of signal received from the sensor. The comparator 60 is normally off when there is no arcing on the line conductor 16, and thus the comparator output is low. When the voltage signal from the sensor is more negative than the reference input (e.g., −0.2 volts), the output from the comparator goes high, and a forward bias is applied to the transistor Q2 that drives the integrator circuit. A capacitor C12 connected from the base of transistor Q2 to −$V_{cc}$ filters out high frequency noise. A diode D11 is connected between the comparator output and the base of the transistor Q2 to block negative signals that would discharge the capacitor C12 prematurely. The rest of the circuit of FIG. 5 is identical to that of FIG. 2.

When a fault occurs, it is desirable to isolate the branch of the distribution system in which the arcing fault occurred, from the rest of the distribution system. In the system of FIG. 1, using the current-type sensor, such isolation is provided by a capacitor C8 connected between the load line 16 and the neutral line 18 in each branch of the distribution system. The capacitor C8 is located between the line interrupter 22 and the power source 14 to provide a low impedance path for an arcing fault from the load line 16 to the neutral line 18, independent of the impedance of the load 20. The capacitor C8 thus prevents a series path from being created between branch circuits, even though the power transformer 14 appears as a high impedance to the high frequency current that an arcing fault generates.

The isolating capacitor C8 allows the sensor 21 to be sensitive even when all the loads are off-line and the impedance is high. As the loads come on-line, the impedance decreases. Without the isolating capacitor C8, a series path could be created between branch circuits. For example, current flow along the neutral line of a first branch circuit, within which an arcing fault is generated, could travel along the load line of the first branch circuit. The current could then continue through the load line of second branch circuit, subsequently flowing along the neutral line of the second branch circuit. The isolating capacitor C8 prevents this pathway between branch circuits from being formed.

With the voltage-type sensor shown in FIG. 5, isolation is provided by an inductor L2 in the load line 16 for each branch circuit. Each inductor L2 is located between the line interrupter 22 and the sensor 21 to provide an impedance for the current produced by an arcing fault.

The isolating capacitors C8 and the isolating inductors L2 may be used simultaneously in their respective positions in the branch circuits. This combination can be particularly useful if the sensors monitor both the current and voltage changes in the branch circuits to detect arcing faults.

The arcing fault detection system also includes a blocking filter 23 in each branch circuit for blocking false arcing fault signals or other nuisance output signals generated by normal operation of the load 20. Each blocking filter 23 is connected between the sensor 21 and the load 20 in each branch circuit to prevent false arcing fault signals from being delivered to the sensor 21. As seen in FIGS. 2 and 5, the preferred blocking filter includes a pair of capacitors C9a and C9b connected between the load line 16 and the neutral line 18 of each branch circuit. An inductor L3 is connected in the load line 16 between the two capacitors C9a and C9b. Preferably, the capacitors C9a and C9b have a rating across the line of about 0.47 uF. The inductor L3 has a rating for 15 amps at 500 uH and dimensions of about 1.5" diameter and 1.313" in length (e.g., Dale IHV 15–500). These values, of course, can be adjusted for the power rating of the electrical system and the loads 20.

The capacitor C9a creates a low impedance path for any series arcing that occurs upstream of that capacitor, such as arcing within the wall upstream of a noisy load. This permits series arcing to be detected in the branch containing the blocking filter. The inductor L3 creates an impedance that does most of the attenuation of the signal created by a noisy load. This inductor is sized to carry the load current of the device, which is typically 15 or 20 amperes. The second capacitor C9b reduces the amount of inductance required in the inductor L3, by creating a low impedance path across the load 20.

One of the advantages of the blocking filter 23 is that it can be used locally on a particular branch circuit that is known to connect to a load 20 which is noisy. The expense of using the blocking filter 23 is reduced since it can be used only where needed. The blocking filter 23 also allows easy retrofitting to existing electrical distribution systems in residences and commercial space.

Although the above system has been described in connection with an ordinary 120 volt system, it is applicable to the voltages of any standard, including 12, 120, 240, 480, 600 and 18500 volts. The system is suitable for use in residential, commercial and industrial applications, single-shot or multiphase systems and at all frequencies for a-c. as well as d-c. This system is applicable to automotive, aviation, and marine needs, separately derived sources such as generators or UPS, and capacitor banks needing incipient fault protection.

Although the above system has been illustrated with circuit breakers, it can also be used with circuit/load monitoring devices, motor monitoring devices, receptacles, cord plugs, portable diagnostic devices, appliances, switches and fuses.

One of the many application of the above system is its use with ground fault circuit interrupters (GFCI's). An example of a ground fault interrupter is a fast acting circuit breaker that disconnects equipment from the power line when some current returns to the source through a ground path. Under normal circumstances all current is supplied and returned within the power conductors. But if a fault occurs and leaks some current to ground, the GFCI senses the difference in current in the power conductors. If the fault level exceeds the trip level of the GFCI, which is usually at about 6 mA, the GFCI disconnects the circuit.

Three types of GFCI are commonly available. The first or separately enclosed type is available for 120-volt, 2-wire and 12/240-volt, 3-wire circuits up to 30 amp. The second type combines a 15-, 20-, 25-, or 30-amp circuit breaker and a GFCI in the same plastic case. It is installed in place of an ordinary breaker in a panelboard and is usually available in 120-volt, 2-wire, or 120/240-volt, 3-wire types which may also be used to protect a 240-volt, 2-wire circuit. The second type provides protection against ground faults and overloads for all outlets on the circuit. A third type having a receptacle and a GFCI in the same housing provides only ground-fault protection to the equipment plugged into that receptacle. There are feed-through types of GFCI which provide protection to equipment plugged into other ordinary receptacles installed downstream on the same circuit.

Ground fault equipment is commercially available from the Square D Company under the catalog designations GROUND CENSOR™, HOMELINE®, QO®, TRILLIANT® and MICROLOGIC® ground fault modules. This ground fault equipment is suitable for protection of main, feeder, and motor circuits on electrical distribution systems. It is also usable as ground fault relay and ground fault sensing devices. The arc detection systems described above can be advantageously used to supplement the circuit protection provided by all the foregoing types of GFCIs.

The term arcing fault, as used herein, includes faults caused by either series arcs (both line and neutral) or parallel arcs (line to line, line to ground, or line to neutral). The term arc, as used herein, includes not only a discharge of electricity through a gas or across an insulating medium, but also high impedance faults or other intended or unintended circuit paths which do not have sufficient energy or current flow to trip a breaker, but nevertheless can generate damaging heat or other undesirable effects.

The term mutual inductance, as used herein, is the property shared by neighboring inductors or inductive devices which enables electromagnetic induction to take place. The term rate of current or voltage change, as used herein, measures the change the current or voltage over the period in time corresponding to the measurement. The current generates a flux around the conductor which rapidly changes with the fluctuations in current.

Figure 6:
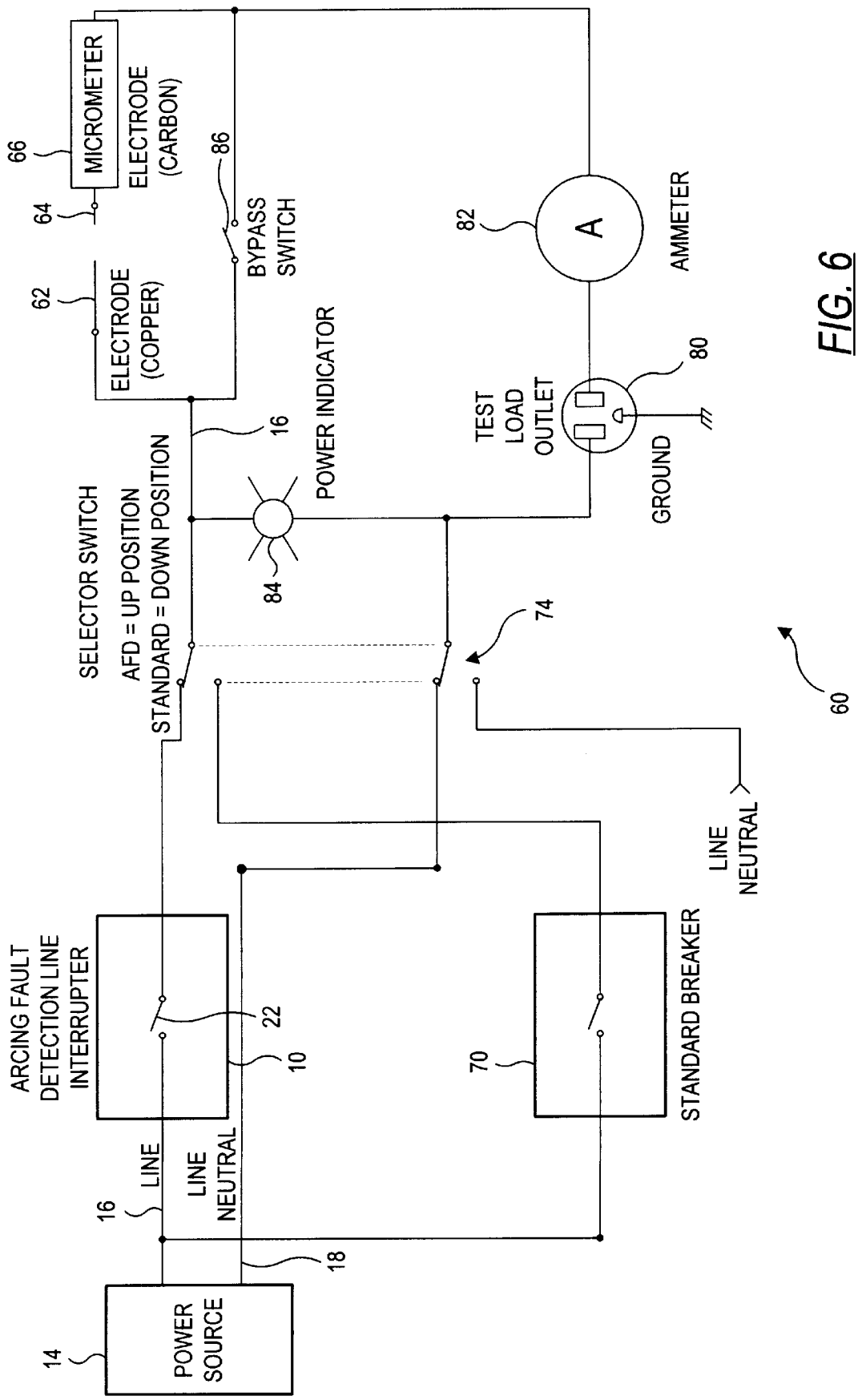
FIG. 6 is a schematic diagram of an arcing fault detector demonstrator apparatus according to the preferred embodiment of the present invention.

Referring now to FIG. 6, there is provided a schematic diagram of an arcing fault detector testing and demonstration system generally designated by reference numeral 60. The demonstration system 60 is preferably enclosed within a portable housing (not shown) so that it may be easily transported to various demonstration or testing sites. The housing may be varied in size or eliminated altogether to suit the individual needs of a user. The testing and demonstration system 60 comprises an electrical circuit including a line conductor 16 and a neutral conductor 18 connecting a power source 14 to a load.

Power is supplied to the testing and demonstration system 60 by connecting the line conductor 16 to an external power source 14 by means of a standard electrical outlet or any other suitable means known in the art. A test load (not shown) is connected to the testing and demonstration system by plugging into a test load outlet 80. In the embodiment shown in FIG. 6, the test load outlet 80 comprises a standard electrical outlet, but it will be appreciated that the test load may be connected to the testing and demonstration system by any other suitable means known in the art. The test load outlet 80 enables the operator to plug in a variety of different loads in order to operate the testing and demonstration system 60 in response to a variety of different loads, including "noisy" loads which may produce high frequency disturbances on the line conductor 16.

A selector switch 74 is movable between an "AFD" (arcing fault detector) position and a "STANDARD" position in order to selectively connect the power source 14 to the test load between two alternate electrical paths. The selector switch 74 may be any of several devices known in the art including, for example, a physical switch movable by an operator or an electrically controllable switching device. When the selector switch 74 is in the "AFD" position, the current flowing through the line conductor 16 is routed to an arcing fault detector 10, which produces an arcing fault detection signal and triggers the line interrupter 22 to an open-circuit condition if an arcing fault condition has occurred. Preferably, the arcing fault detector 10 will be the system described in relation to FIGS. 1–5, but it will be appreciated that other types of arcing fault detectors may be used. When the selector switch 74 is in the "STANDARD" position, the current flowing through the line conductor 16 is routed to a standard circuit breaker 70, which will trip open if the current flowing through the line conductor 16 exceeds the trip curve settings of the circuit breaker. However, the standard circuit breaker 70 typically will not trip open in response to an arcing fault, because the current levels typically are below the trip curve settings of the circuit breaker.

Figure 7:
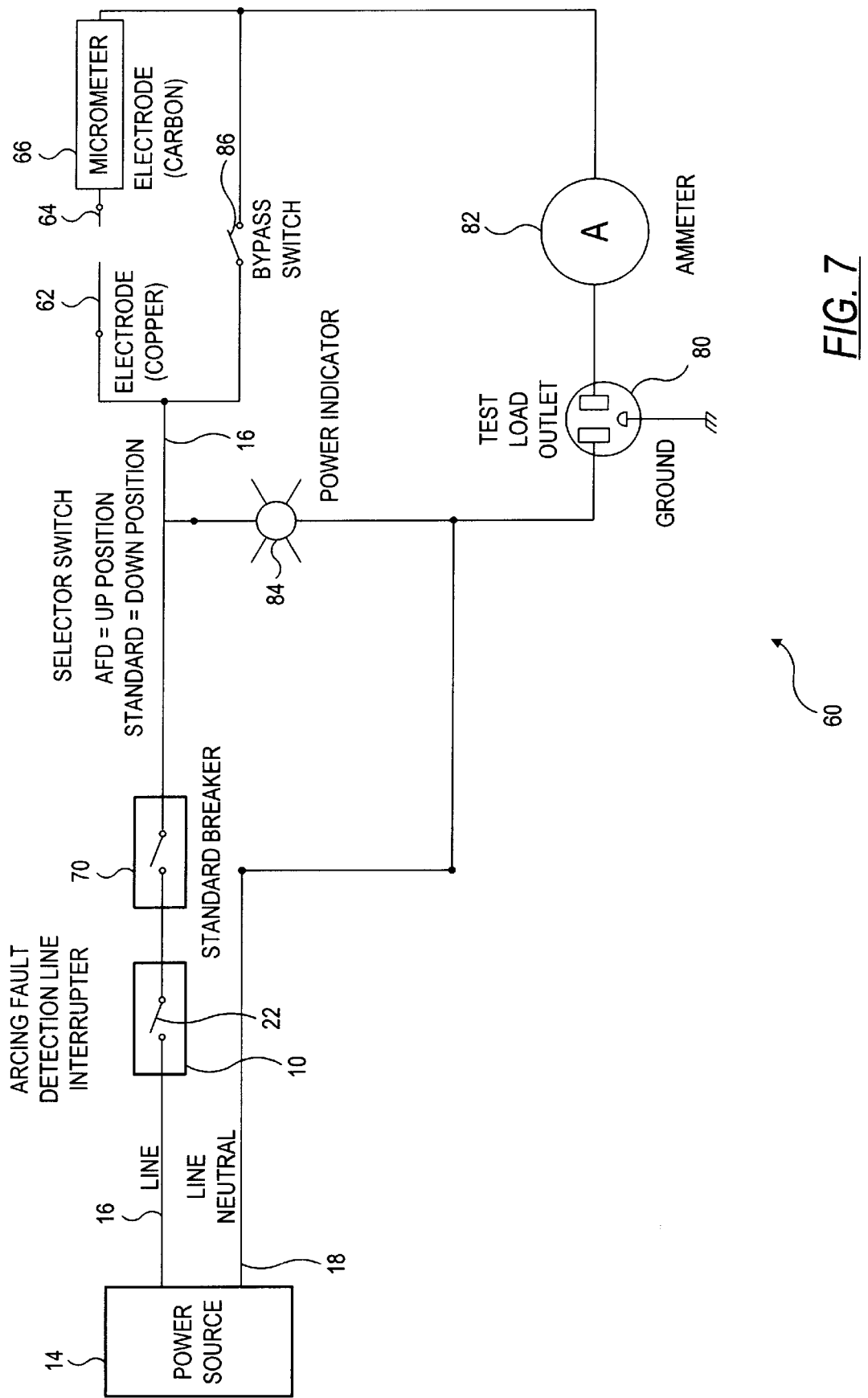
FIG. 7 is a schematic diagram of an arcing fault detector apparatus according to another embodiment of the present invention.

Alternatively, as shown in FIG. 7, the arcing fault detector 10 and standard circuit breaker 70 may be connected in series rather than in parallel. In such a case, the selector switch may be eliminated, causing the current flowing through the line conductor 16 to be routed across both the arcing fault detector 10 and standard circuit breaker 70. Additionally, a single line interrupter may be employed rather than both the arc fault detector 10 and the standard circuit breaker having their own associated line interrupter. The arcing fault detector 10 will produce an arcing fault detection signal and trigger the line interrupter 22 to an open circuit condition in response to an arcing fault, while the standard circuit breaker 70 will trigger open the line interrupter in response to a current overload or ground fault condition. In this configuration, however, in the event the circuit is tripped open, some type of external indicator (not shown) must be provided in order to reveal whether the trip signal was produced by the arcing fault detector 10 or by the standard circuit breaker 70.

The testing and demonstration system 60 further includes a first electrode 62 and a second electrode 64 connected to the line conductor 16 between the test load outlet 80 and the selector switch 74. The first and second electrodes 62, 64 are movable between an initial contact position and a separated position in order to receive a load current and produce a "series" arcing condition between them. In the embodiment shown in FIG. 6, the first electrode 62 is stationary while the second electrode 64 is movable away from the first electrode until the electrodes are separated by the distance needed to produce the desired arcing condition. Alternatively, the first electrode 62 may be movable and the second electrode 64 stationary, or both electrodes 62, 64 may be movable, as long as the electrodes are movable relative to each other. The electrodes 62, 64 may be movable by means of a micrometer 66, as shown in FIG. 6, or by any other suitable means known in the art for linearly positioning the electrodes 62, 64 relative to each other. In either case, whether using a micrometer 66 or an alternative linear positioning device, the act of adjusting the relative position of the electrodes may be accomplished by a user manually adjusting the positioning device, or by the positioning device being remotely controlled by a computer or other suitable control system. In an embodiment in which the linear positioning device is controlled by a computer, the computer may be programmed to move the positioning device in a precise incremental step pattern or at a predetermined rate. The same computer program may thereafter be used in repeated tests or demonstrations of the system 60 if it is desired to accurately repeat the same pattern of movement of the electrodes 62, 64.

In a preferred embodiment, one of the two electrodes 62, 64 is made of copper and the other of the two electrodes 62, 64 is made of carbon, in order to simulate corroded, worn or aged wiring or insulation which has become "carbonized" and is capable of sustaining a dangerous arcing fault condition. Upon receiving the load current, a high temperature is produced and sustained across the interface between the two electrodes 62 and 64, ionizing the gas between them and creating an arcing fault condition. As will be appreciated by those skilled in the art, arcing fault conditions may also be produced at the interface between electrodes made of alternate materials, but it has been found that a carbon-copper electrode interface is ideal for producing arcing fault conditions.

In the embodiment shown in FIG. 6, the testing and demonstration system 60 further includes an ammeter 82 between the test load outlet 80 and the electrodes 62, 64 for monitoring the level of current provided to the electrodes 62, 64. A bypass switch 86 is connected in parallel to the electrodes 62, 64 to enable a user to bypass the electrodes 62, 64 when the bypass switch 86 is in a closed position. The testing and demonstration system 60 further includes an indicator light 84 for indicating when power is being supplied to the system 60 and for indicating when the line interrupter 22 has been tripped open in response to the detection of an arcing fault, current overload or ground fault condition. When power is being supplied to the system 60, the indicator light 84 is illuminated. Thereafter, upon the line interrupter 22 being tripped open in response to a fault condition, the indicator light 84 becomes de-illuminated, indicating that power is no longer being supplied to the load. As will be appreciated by those skilled in the art, however, other types of indicator devices may be used in place of or in addition to an indicator light. As an additional safety measure, a welding screen (not shown) may be provided to shield the user from direct observation of an arcing condition.

One preferred method of demonstrating the system 60 is described as follows. With the selector switch 74 in the "STANDARD" position, the operator first plugs a test load such as a hair dryer into the test outlet 80. The operator then adjusts the electrodes 62, 64 so that they are touching each other, turns on the hair dryer and observes the ammeter 82 to determine the level of load current flowing through the electrodes. Next, the operator slowly separates the electrodes 62, 64 by rotating the micrometer 66 until arcing is produced across the electrodes, using the ammeter 82 to show that the load current decreases only slightly when arcing is produced, and using the standard circuit breaker 70 to show that it does not detect the arcing fault condition. A combustible material such as wood or plastic may then be placed near the electrodes to show that a fire is easily created by the arcing fault condition. In the next phase of the demonstration, after the electrodes 62, 64 have been readjusted to their initial positions, the operator moves the selector switch 74 to the "AFD" position, plugs a test load into the test outlet 80, and again slowly separates the electrodes 62, 64 until arcing is produced. In this phase, however, it can be observed that the arcing fault detector 10 is able to detect the arcing fault condition and trip open the circuit after only a short flash is produced between the electrodes which is generally insufficient to start a fire, thus indicating that arcing fault detectors provide a significant degree of fire protection not provided by standard circuit breakers.

Alternatively, the system 60 may be operated as follows. With the selector switch 74 in the "STANDARD" position, the operator plugs a test load into the test outlet 80 and adjusts the electrodes 62, 64 until arcing is produced across the electrodes in the manner described above. Then, while the arcing fault condition is occurring and after observing that the standard circuit breaker 70 does not detect the arcing fault condition, the operator moves the selector switch 74 to the "AFD" position to show that the arcing fault detector 10 is able to detect the arcing fault condition and trip open the circuit.

While the present invention has been described with reference to one or more particular embodiments, those skilled in the art will recognize that many changes may be made thereto without departing from the spirit and scope of the present invention. Such variations are contemplated as falling within the spirit and scope of the claimed invention, as set forth in the following claims.

We claim:

1. A system for demonstrating or testing the operation of an arcing fault detector in comparison to a standard circuit breaker, the system comprising:

a power circuit including a power source, a load, and a standard circuit breaker;

an arcing fault detector and associated line interrupter in parallel with said standard circuit breaker;

pair of electrodes connected in series with said load for producing an arcing condition; and a selector switch for selectively connecting said pair of electrodes to one of said standard circuit breaker and said arcing fault detector and associated line interrupter.

2. The system of claim 1 wherein the standard circuit breaker, the arcing fault detector and the pair of electrodes are physically remote from an electrical distribution panelboard so that demonstration and testing of the arcing fault detector in comparison to the circuit breaker may be accomplished remote from the panelboard.

3. The demonstration and testing system of claim 2 further comprising an ammeter connected between said load and said pair of electrodes for monitoring levels of load current supplied to said pair of electrodes.

4. The demonstration and testing system of claim 3 further comprising an indicator device for indicating when power is being supplied to said demonstration and testing system.

5. The demonstration and testing system of claim 4 wherein the indicator device further indicates when power to said demonstration and testing system has been interrupted by said line interrupter.

6. The demonstration and testing system of claim 2 wherein one of said pair of electrodes is comprised of copper and another one of said pair of electrodes is comprised of carbon.

7. The demonstration and testing system of claim 6 wherein a first one of said pair of electrodes is in a stationary position and a second one of said pair of electrodes is movable to a variable position relative to the first electrode.

8. The demonstration and testing system of claim 6 further comprising a linear positioning device for positioning the second electrode relative to the position of the first electrode.

9. The demonstration and testing system of claim 8 wherein the standard circuit breaker, arcing fault detector, pair of electrodes and selector switch are enclosable within a portable case.

10. A method of demonstrating or testing the operation of an arcing fault detector in comparison to a standard circuit breaker, said method comprising the steps of:
   supplying a load current to a pair of electrodes;
   producing a simulated arcing fault condition between said pair of electrodes;
   selectively connecting said pair of electrodes to an arcing fault detector and to a standard circuit breaker;
   observing that the standard circuit breaker does not trip in response to the simulated arcing fault condition; and
   observing that the arcing fault detector trips in response to the simulated arcing fault condition.

11. A system for demonstrating or testing the operation of an arcing fault detector in comparison to a standard circuit breaker, the system comprising:
   an electrical circuit including line and neutral conductors connected between a power source and a load, said line conductor carrying an electrical signal between said power source and said load;
   a selector switch positioned between the power source and the load and movable between a first position and a second position;
   an arcing fault detector and associated line interrupter connected to said line conductor between said power source and said selector switch, said electrical signal being provided to said arcing fault detector in response to said selector switch being in said first position, said electrical signal not being provided to said arcing fault detector in response to said selector switch being in said second position;
   a standard circuit breaker in parallel to said arcing fault detector and connected to said line conductor between said power source and said selector switch, said electrical signal being provided to said standard circuit breaker in response to said selector switch being in said second position, said electrical signal not being provided to said standard circuit breaker in response to said selector switch being in said first position; and
   a pair of electrodes positioned between said selector switch and said load for producing an arcing condition on said line conductor.

12. The system of claim 11 wherein the standard circuit breaker, the arcing fault detector and the pair of electrodes are physically remote from an electrical distribution panelboard so that demonstration and testing of the arcing fault detector in comparison to the circuit breaker may be accomplished remote from the panelboard.

13. The demonstration and testing system of claim 12 wherein a first one of said pair of electrodes is comprised of copper and a second one of said pair of electrodes is comprised of carbon.

14. The demonstration and testing system of claim 12 wherein a first one of said pair of electrodes is in a stationary position and a second one of said pair of electrodes is movable to a variable position relative to the first electrode, said demonstration and testing system including a linear positioning device for positioning the second electrode relative to the position of the first electrode.

15. A system for demonstrating or testing the operation of an arcing fault detector in comparison to a standard circuit breaker, the system comprising:
   an electrical circuit including line and neutral conductors connected between a power source and a load, said line conductor carrying an electrical signal between said power source and said load;
   a pair of electrodes positioned between said power source and said load for producing an arcing condition on said line conductor;
   a line interrupter for interrupting the electrical signal between said power source and said load in response to receiving a trip signal;
   an arcing fault detector connected to said line conductor between said power source and said pair of electrodes, said arcing fault detector producing said trip signal upon detection of an arcing fault on said line conductor;
   a standard circuit breaker connected in series to said arcing fault detector on said line conductor between said power source and said pair of electrodes, said standard circuit breaker producing said trip signal upon detection of an overcurrent condition on said line conductor; and
   indicator means for indicating which one of said arcing fault detector and said standard circuit breaker produced said trip signal in response to said line interrupter interrupting the electrical signal between said power source and said load.

16. The system of claim 15 wherein the standard circuit breaker, the arcing fault detector and the pair of electrodes are physically remote from an electrical distribution panelboard so that demonstration and testing of the arcing fault detector in comparison to the circuit breaker may be accomplished remote from the panelboard.

17. The demonstration and testing system of claim 16 further comprising:
   an ammeter connected in series with said load for monitoring levels of load current supplied to said pair of electrodes;
   an indicator device for indicating when power is being supplied to said demonstration and testing system; and
   a bypass switch movable between an open position and a closed position, said load current being provided to said pair of electrodes in response to said bypass switch being in said open position, said load current bypassing said pair of electrodes in response to said bypass switch being in said closed position.

18. The demonstration and testing system of claim 17 wherein the indicator device further indicates when power to said demonstration and testing system has been interrupted.

19. The demonstration and testing system of claim 16 wherein a first one of said pair of electrodes is comprised of copper and a second one of said pair of electrodes is comprised of carbon.

20. The demonstration and testing system of claim 16 wherein the first electrode is in a stationary position and the second electrode is movable to a variable position relative to the first electrode, said demonstration and testing system including a linear positioning device for measuring the position of the second electrode relative to the position of the first electrode.

21. The method of claim 10 wherein the standard circuit breaker, the arcing fault detector and the pair of electrodes are physically remote from an electrical distribution panelboard so that demonstration and testing of the arcing fault detector in comparison to the circuit breaker may be accomplished remote from the panelboard.

22. The demonstration and testing system of claim 12 further comprising:

- an ammeter connected in series with said load for monitoring levels of load current supplied to said pair of electrodes;
- an indicator device for indicating when power is being supplied to said demonstration and testing system and for indicating when power to said demonstration and testing system has been interrupted by said line interrupter; and a bypass switch movable between an open position and a closed position, said load current being provided to said pair of electrodes in response to said bypass switch being in said open position, said load current bypassing said pair of electrodes in response to said bypass switch being in said closed position.

23. The demonstration and testing system of claim 4 further comprising a bypass switch movable between an open position and a closed position, said load current being provided to said pair of electrodes in response to said bypass switch being in said open position, said load current bypassing said pair of electrodes in response to said bypass switch being in said closed position.

* * * * *